United States Patent [19]

Schweitzer, Jr.

[11] Patent Number: 4,646,006
[45] Date of Patent: Feb. 24, 1987

[54] CLAMP MECHANISM FOR POWER LINE MOUNTED MONITORING DEVICE

[76] Inventor: Edmund O. Schweitzer, Jr., 2433 Center St., Northbrook, Ill. 60062

[21] Appl. No.: 625,528

[22] Filed: Jun. 28, 1984

[51] Int. Cl.⁴ .................... G01R 1/22; A47F 13/06; H01F 17/06
[52] U.S. Cl. .................... 324/127; 294/19.1; 324/133; 336/176
[58] Field of Search ............ 324/127, 117 R, 133, 324/129, 149; 336/176, 96; 294/110.1, 99.1, 93, 19.1

[56] References Cited

U.S. PATENT DOCUMENTS 2,190,143  2/1940  Barnes et al. ............... 24/502

FOREIGN PATENT DOCUMENTS 0991779  10/1951  France .................... 324/127

Primary Examiner—Ernest F. Karlsen
Assistant Examiner—Vinh P. Nguyen
Attorney, Agent, or Firm—Lockwood, Alex, FitzGibbon & Cummings

[57] ABSTRACT

A clamping mechanism for mounting a monitoring device to a electrical cable includes a pair of clamp members biased for engaging movement toward one another. A compression member between the clamp members ordinarily prevents engaging movement of the members. When pressed against a cable, the compression member deforms to allow the clamp members to move toward one another and encircle the cable and clamp the device thereon.

9 Claims, 8 Drawing Figures

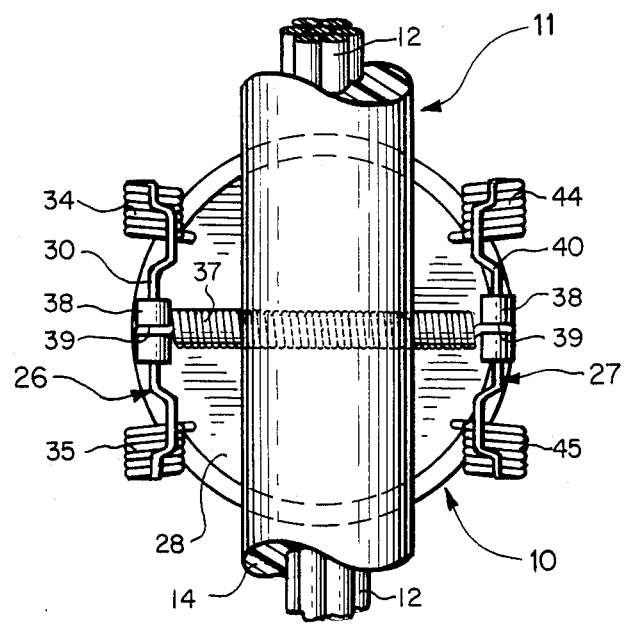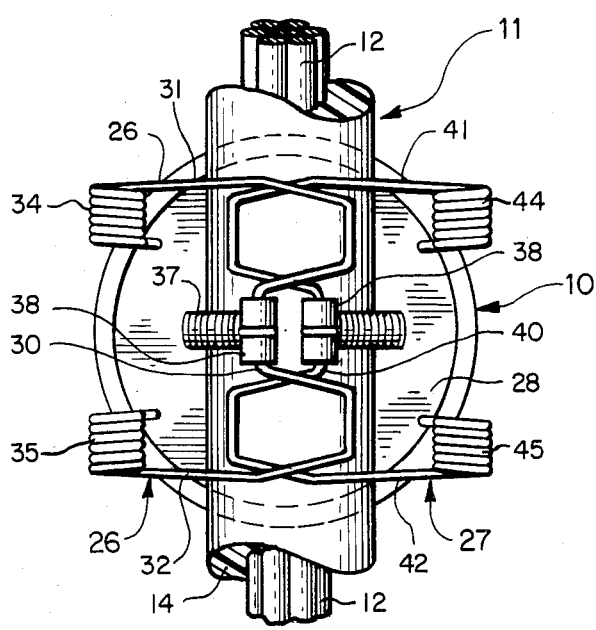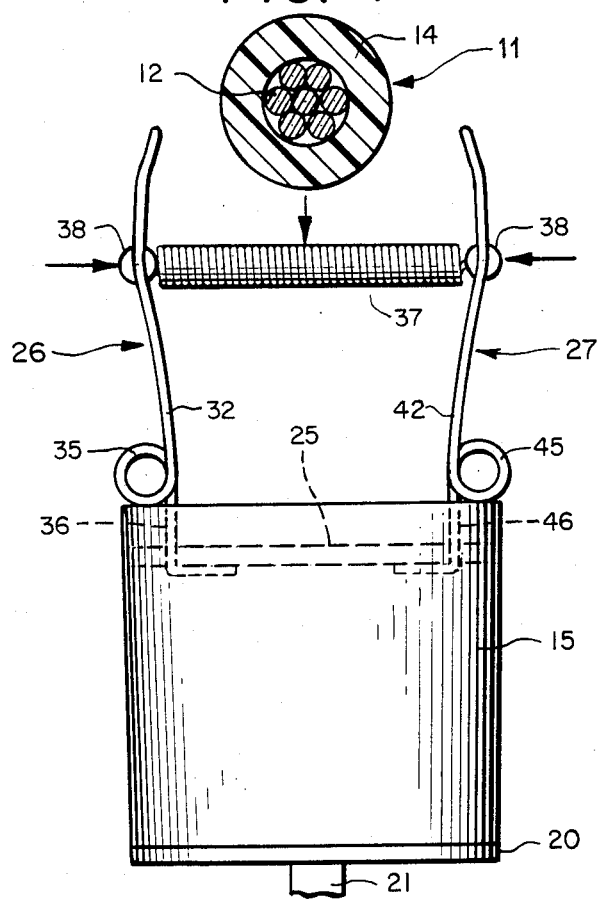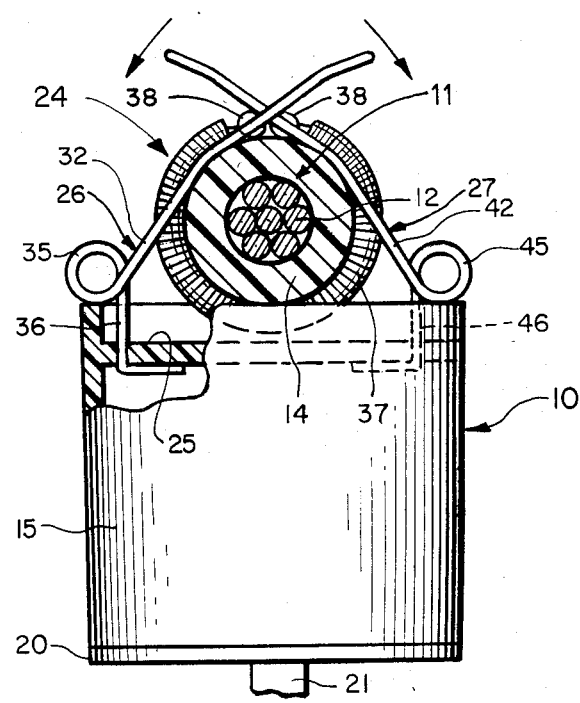

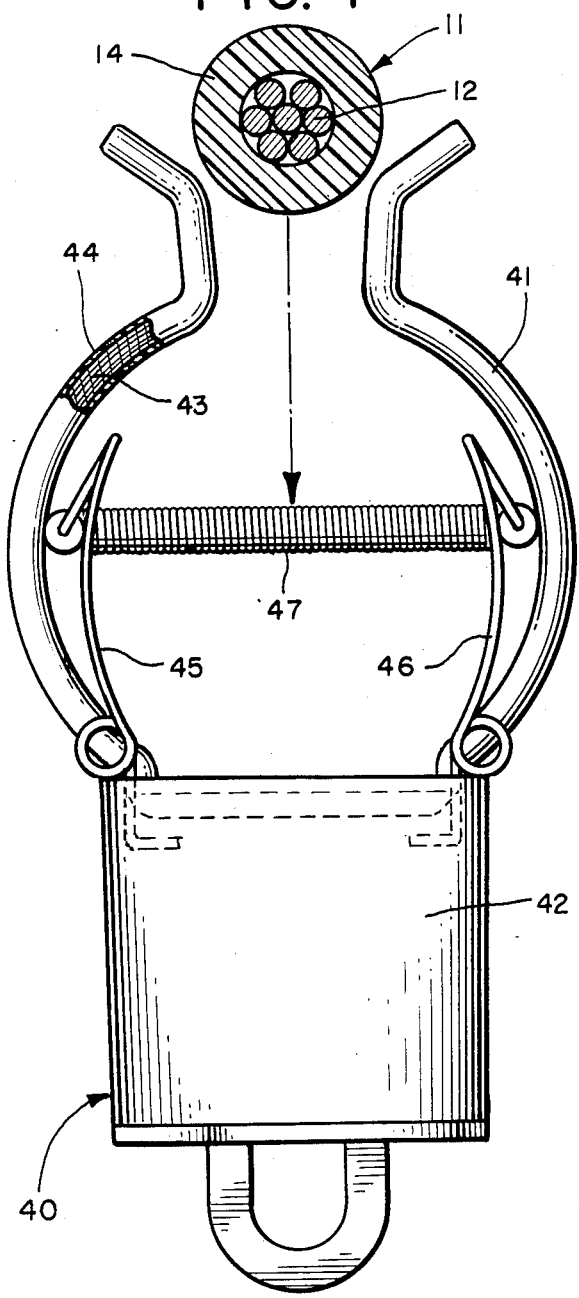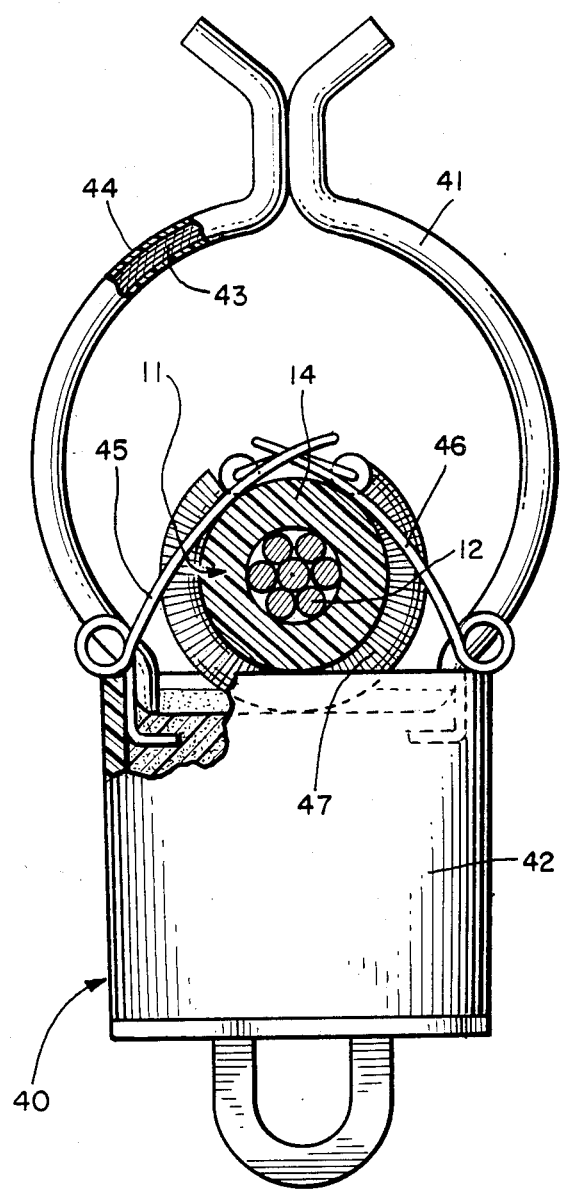

CLAMP MECHANISM FOR POWER LINE MOUNTED MONITORING DEVICE

BACKGROUND OF THE INVENTION

The present invention relates generally to circuit condition monitoring devices for use in electrical power distribution systems, and in particular to a clamp mechanism for clamping such devices to the cables of such distribution systems.

Electrical power distribution systems may require the use of a variety of circuit condition monitoring devices to facilitate the detection and location of system malfunctions. Such devices include manually and automatically reset current fault indicators, such as those manufactured by E. O. Schweitzer Manufacturing Co., and described in U.S. Pat. Nos. 4,288,743, 4,086,529 and 3,676,740 of the present inventor, as well as voltage monitoring devices, such as described in U.S. Pat. Nos. 4,251,770, 4,152,643, 4,263,350 and in U.S. patent application No. 518,536, filed July 29, 1983, now U.S. Pat. No. 4,550,288, of the present inventor. The devices may be either of the test point mounted type for mounting on a system test point, or of the clamp-on type, for clamping directly onto a cable of the system.

Clamp-on type devices typically include a housing containing monitoring circuitry, a circuit condition indicator, and some form of clamp mechanism affixed to the housing for mounting the housing on a cable. Frequently, the clamp mechanism serves the additional function of establishing either magnetic or electrostatic communication, or both, between the cabler and appropriate sensing components of the monitoring apparatus.

Clamp mechanisms of the type previously known in the art for mounting distribution system monitoring devices typically required the use of both hands as well as a pair of live-line handling tools during installation on a system cable. Consequently, such clamp mechanisms were undesirably difficult and time consuming to install, and provided an undesirable risk of electric shock as a result of the additional manipulation required.

In one prior clamp mechanism, which is described in U.S. patent application No. 289,916, filed Aug. 4, 1981, now U.S. Pat. No. 4,456,873, of the present inventor, a plurality of flexible metallic strips are combined to form a generally square-shaped magnetic core for use with a circuit condition monitoring device. One end of the core is affixed to the device housing, and the opposite end is detachably received within an aperture in the housing opposite the first end. In use, the free end of the core is displaced from the device housing, allowing the core to be passed around a cable. The free end is then inserted in the aperture to lock the device to the cable. A similiar core structure is shown in U.S. Pat. No. 3,725,832 of the present inventor.

In another prior clamp mechanism, which is described in U.S. Pat. No. 4,288,743, two insulated metallic members project from the rear surface of the device. A third spring-biased member normally occupies a position engaging the two projecting members, but can be displaced from the members to allow a cable to be introduced between the two members. The spring-biased member is then allowed to return to its normal position to clamp the device to the cable.

The present invention is directed to a clamping mechanism for automatically clamping a monitoring device to an electrical cable such as utilized in an electrical distribution system. In particular, the invention is directed to a clamp mechanism which is automatically actuated closed when the mechanism is brought into contact with a cable, thereby allowing a lineman to install the monitoring device with the use of only one hand. Considerable time is saved through use of such a mechanism, and the resulting one-hand installation contributes to safety, particularly where it is necessary for the lineman to ascend a ladder in order to install the device, or where the monitored cable is closely spaced to other cables and can only be approached from one direction.

Accordingly, it is a general object of the present invention to provide a new and improved clamp mechanism for circuit monitoring devices.

It is a more specific object of the present invention to provide a clamp mechanism for clamping a circuit condition monitoring device to the cable of a power distribution system which requires the use of only one hand during installation.

It is a further object of the invention to provide a clamp mechanism for a cable-mounted closed-core condition monitoring device wherein the core is actuable to an open condition for receiving the cable, and is automatically actuated to a closed condition upon engaging the cable.

SUMMARY OF THE INVENTION

The invention is directed to an automatic clamping mechanism for mounting circuit condition monitoring devices and the like to an electrical cable of a power distribution system. A pair of clamp members each dimensioned to partially encircle the cable are attached at one end to the monitoring device and biased for engaging movement toward one another. Means including a laterally deformable compression member, resistant to forces applied along its longitudinal axis and deformable by application of force transverse to its longitudinal axis, are longitudinally disposed between the remaining ends of the clamp members to prevent engaging movement of the clamp members. When the compression member is pressed against a cable the resulting lateral deformation of the compression member allows the clamp members to move toward engagement and clamp the cable therebetween.

BRIEF DESCRIPTION OF THE DRAWING

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 3 is a top plan view of the fault indicator illustrated in FIG. 2 showing the clamping mechanism in an open position prior to installation of the fault indicator on the cable.

FIG. 4 is a side elevational view of the fault indicator shown in FIG. 3 showing the clamp mechanism in the process of being installed on the cable.

FIG. 5 is a top plan view of the fault indicator shown in FIG. 4 showing the fault indicator in a closed position on the cable.

FIG. 6 is a side elevational view, partially in section, of the fault indicator illustated in FIG. 5, showing the clamping mechanism in a closed position around the cable.

FIG. 7 is a side elevational view, partially in section, showing a current-actuated core-type circuit monitoring device including a clamp mechanism constructed in accordance with the invention in an open condition for engaging a cable.

FIG. 8 is a side elevational view similar to FIG. 7 showing the monitoring device in engagement with the cable.

DESCRIPTION OF THE PREFERRED EMBODIMENT

Figure 1:
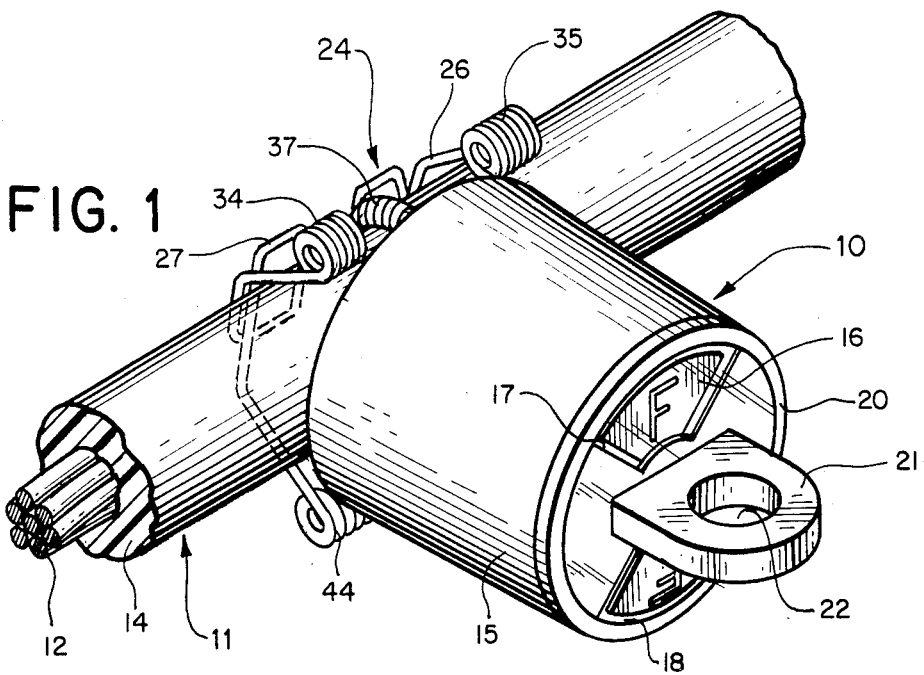
FIG. 1 is a front perspective view of a current fault indicator equipped with an automatic clamping mechanism constructed in accordance with the invention showing the fault indicator installed on a cable of a power distribution system.
Figure 2:
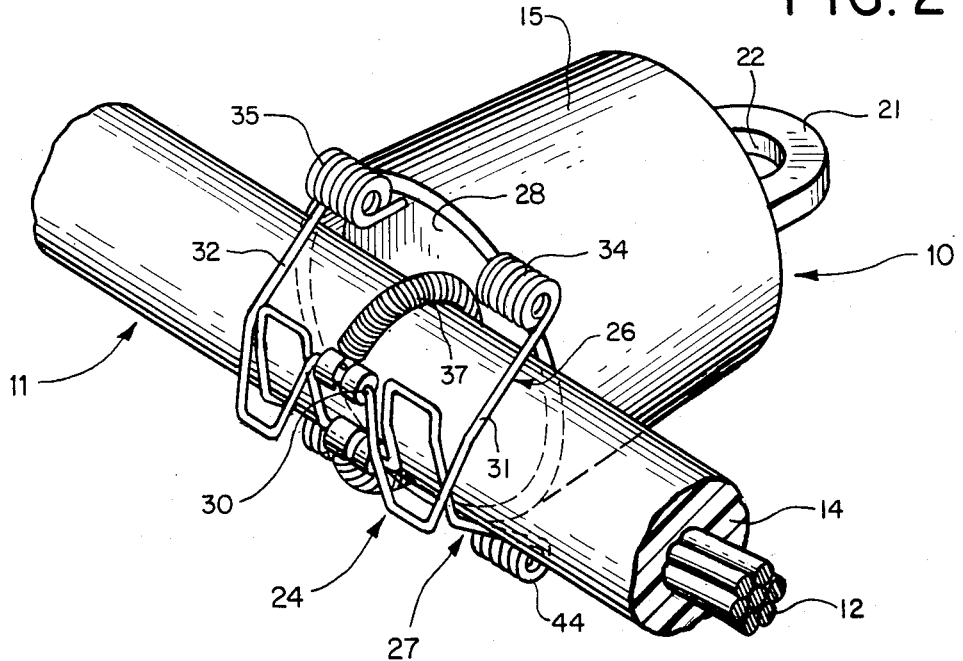
FIG. 2 is a rear perspective view of the fault indicator illustrated in FIG. 1 showing the principal components of the clamping mechanism.

Referring to the Figures, and particularly to FIGS. 1 and 2, a circuit condition monitoring device, in this case a current fault indicator 10, is illustrated in its normal operating position on an electrical cable 11 of an electrical power distribution system. In accordance with conventional practice, cable 11 comprises a plurality of metallic conductor elements 12, encased within an insulating sheath 14. Fault indicator 10 includes an insulated cylindrical housing 15 at one end of which a disc shaped indicator flag 16 is mounted for rotation on a pivot. The flag 16 is visible through windows 17 and 18 provided in wall 20 of the housing 15 opposite cable 11. Upon the occurrence of a fault, indicator flag 16 rotates to the position shown to provide a visual indication that current in excess of a predetermined level has flowed in cable 11. A tab 21 projecting perpendicularly outward from end wall 20 is provided with an aperture 22 for receiving the hooked end of a conventional live-line tool (not shown) to enable a lineman to safely position the fault indicator on a live conductor.

In order for fault indicator 10 to accurately respond to the occurrence of fault current in cable 11, it is necessary that the device be firmly positioned adjacent the cable as shown in FIGS. 1 and 2. To this end, the fault indicator is provided with a clamp mechanism 24 constructed in accordance with the invention. As best seen in FIG. 2, the clamp mechanism is attached to the end wall 25 of housing 15 opposite end wall 20 and fixes the device in close contact with the cable.

Referring to FIGS. 2-4, the clamp mechanism 24 is seen to include generally a pair of opposed spring-biased clamp members 26 and 27, each mounted to the rear surface 28 of the device housing, and each adapted to partially encircle cable 11. When the clamp members are brought into engaging relationship with one another, as best seen in FIGS. 2, 5 and 6, they encircle cable 11 thereby entrapping the conductor between themselves adjacent to the rear wall 25 of the housing.

In the embodiment illustrated, the clamp members 26 and 27 each comprise a section of spring steel wire. Referring to FIGS. 2 and 5, clamp member 26 is seen to comprise a generally W-shaped structure having a center section 30 and a pair of generally parallel-spaced side segments 31 and 32. Each of these segments terminates in spring-bias means in the form of respective ones of coil spring sections 34 and 35 integrally formed therein which serve to bias the clamp members into engaging relationship with one another. As may best be seen in FIG. 6, spring section 34 terminates in a segment of wire embedded in the rear wall of housing 15. A similar segment projects from spring section 35 and is similarly embedded in the rear wall. In this manner, clamp member 26 is rigidly attached to the rear of fault indicator 10 while the center and end segements remain free to rotate about the common axis of the coil spring sections. The coil spring sections are located and arranged so that when unrestrained, clamp member 26 rotates in the direction shown by the arrow in FIG. 6.

Clamp member 27 may be identical with clamp member 26, having a center section 40, a pair of parellel-spaced segments 41 and 42, and a pair of coil spring segments 44 and 45, and may be similarly mounted to the device housing by means of extending sections 46 and 47 so that its natural movement is toward clamp member 26 to cooperate with that member to clamp the device onto cable 11.

To hold the clamp members away from one another until a conductor is passed therebetween, the clamp mechanism, in accordance with the invention, includes a laterally deformable compression member in the form of a helical coil spring member 37. It is a property of the compression member that it resists deformation by forces applied along with its longitudinal axis (i.e., forces applied toward one another at each end of the member) while deforming in response to forces applied perpendicular to this axis (i.e., forces applied against the side of the member).

As best illustrated in FIGS. 3 and 4, coil spring 37 is attached at one end to the center section 30 of clamp member 26 and at the other end to the center section 40 of clamp member 27 so that it is disposed between the members. At each of its ends, the spring is attached to the respective clamp member by means of a cylindrical collar 38, which may be fashioned from brass or a similar material, and which surrounds the straight center segment of the respective clamp member. The collars each include a groove 39 extending circumferentially around their outer surface mid-way between each end which receives a loop formed in the associated end of spring member 37 by means of which each end of the spring member is rotatably attached to its respective clamp member.

Referring to FIG. 4, it may be seen that coil spring member 37 is dimensioned so that in its compressed condition, it snuggly fits between clamp members 26 and 27 when those members are rotated to the position at which they are substantially parallel to one another. By being so dimensioned and positioned, the forces applied to spring member 37 by clamp members 26 and 27 by reason of the respective spring segments of the clamps are applied substantially along the longitudinal axis of the spring member. Because of its inherent resistance to such an applied force, the spring member acts as a rigid spacing member to prevent motion of the clamp members toward one another. Accordingly, in the absence of any other applied forces, the coil spring member 37 maintains the clamp members in the open position shown in FIGS. 3 and 4.

FIGS. 3-6 illustrate automatic closure of the clamping mechanism. In FIGS. 3 and 4, clamp members 26 and 27 have been manually displaced from one another so that spring member 37 occupies the straight, substantially horizontal, position illustrated. To install the fault indicator 10 on cable 11, the device is moved perpendicularly toward the cable so that the displaced outer ends of clamp members 26 and 27 pass on either side of the cable and the side of spring member 37 comes into contact with the cable. When cable 11 contacts the spring member, a lateral force is applied to the spring member which, if motion of the fault indicator toward the cable continues, is eventually sufficient to cause the spring to deform in the direction indicated by the arrow in FIG. 4. When spring member 37 has thus been deformed, it is no longer able to withstand the longitudinal force applied by members 26 and 27, allowing these members to move toward one another and encircle cable 11.

FIGS. 5 and 6 illustrate the relative positions of cable 11, fault indicator 10, clamp members 26 and 27, and spring member 37 following actuation of the clamp mechanism. As illustrated, cable 11 lies beneath clamp members 26 and 27, and rests against the bottom wall of device housing 15. Spring member 37 extends peripherially around the outer surface of the insulating sheath 14 as shown, the pivotal attachment of spring member 37 to the clamp members allowing it to assume the position illustrated in FIG. 6. Because the spring member can be stretched along its linear axis, it will automatically adapt itself to encircle cables of differing diameters. In this regard, clamp members 26 and 27 will rotate toward one another until they each contact the outer surface of the conductor. Accordingly, the clamp mechanism automatically adjusts to the dimension of the particular cable encountered.

Prior to installing the fault indicator on a cable, the clamp members, as previously developed, are manually separated until spring member 37 is in axial alignment, after which they are held apart by the spring member. To enhance safety, this operation is preferably performed in a location removed from the cable. The device is then grasped at engaging tab 21 by means of a single live-line tool and, while being held, is pushed onto the cable until the cable contacts spring member 37, whereupon deformation of the spring member releases the clamp members to automatically clamp the device to the cable. This greatly simplifies the process of installing the device on a high voltage cable. Removal of the device is equally simple, and may be effected by grasping the tab with the live-line tool and pulling the device abruptly away from the conductor.

In practice, it may be desirable to enclose each of the clamp members, as well as the helical spring 37 in a flexible, relatively soft, insulating material, such as rubber, in order to avoid chafing cable 11. Alternatively, where the outer sheath of the cable is electrically conductive the clamp elements and/or spring members may be non-insulated to provide a convenient means for electrical connection between the outer sheath and the circuit monitoring device.

The clamp mechanism of the invention may also be advantageously employed on monitor devices which have a magnetic core which encircles the cable, as shown in FIGS. 7 and 8. In this case, a monitor device 40, which in other structural aspects is similar to monitor device 10, includes a magnetic core 41 which extends from a cylindrical device housing 42 to encircle the monitored cable 11. The core member, in accordance with conventional practice, is formed from a plurality of flat metal strip-like laminations 43, covered with a layer 44 of insulating material such as vinyl.

In the cable-engaging position of device 40, as shown in FIG. 7, a pair of W-shaped clamp members 45 and 46, which may be identical in shape to members 26 and 27, function under the influence of a compression spring member 47 to spread the ends of the core member apart by reason of their center section bearing outwardly against the exposed sides of the core. However, when device 40 is engaged to a cable, as shown in FIG. 8, the clamp members no longer bear against the core, allowing this member to close around the cable. At the same time, the cable is securely engaged in the manner previously described.

While the embodiments shown and described have utilized a pair of clamp members, each of a generally W-shaped configuration and having a pair of integrally formed bias springs, it will be apparent to those skilled in the art that other configurations may be utilized without departing from the scope of the invention in its broader aspects. For example, a pair of rigid, substantially solid clamp members may be rotatably attached to the rear surface of the device housing on opposite sides of the cable 11. Similarly, in another embodiment, one fixed member may extend along one side of the cable while a pivotally mounted relatively movable member on the other side of the cable rotates toward the fixed member to surround the cable. Furthermore, a variety of biasing means may be utilized to displace the clamp members toward one another other than the integrally formed coil springs included in the preferred embodiment. Finally, a compression member other than the coil spring 37 may be substituted. For example, a plurality of cylindrical rigid collar members, each disposed around a relatively flexible cylindrical core, such that the assembly resists forces applied along its longitudinal axis while deforming in response to forces applied parallel to its transverse axis, may be substituted for the coil spring member.

While in the embodiment illustrated in FIGS. 1–6 the clamp mechanism serves principally to affix the circuit monitoring device to the cable, the clamp mechanism may, if required, be easily adapted to provide electrostatic coupling between the cable and the circuitry of the device by extending the ends of the clamp members through the rear wall 28 of the device housing 15 and into proximity or electrical connection with appropriate circuit components of the device.

It will be appreciated that each of the clamp members may be shaped as appropriate for clamping onto members or objects other than the cylindrical cable illustrated herein. Furthermore, while the clamp mechanism has been shown in conjunction with a fault indicating device, it may be used to advantage with other types of monitoring devices, such as voltage indicators.

While particular embodiments of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. An automatic clamping mechanism for mounting a circuit condition monitoring device to an electrical cable, comprising:

a housing for the monitoring device;

a pair of clamp members projecting in generally parallel-spaced relationship from spaced locations on said housing;

at least a portion of the projecting end of each of said clamp members being pivotal toward the other of said clamp members, so that each of said members encircle at least a portion of the cable when the cable is positioned between said inwardly pivoted members;

biasing means associated with each of said clamp members for biasing said projecting portions toward each other; and trigger means including an elongated laterally deformable trigger member extending between said projecting portions for maintaining a spacing between said projecting portions greater than the diameter of the conductor, said trigger member being longitudinally non-compressible in the absence of a lateral deformation to prevent said projecting portions from pivoting toward each other, but longitudinally compressible upon lateral deformation resulting from lateral engagement with the conductor to allow said clamp members to encircle the conductor.

2. An automatic clamping mechanism as defined in claim 1 wherein said trigger member comprises a helical spring.

3. An automatic clamping mechanism as defined in claim 2 wherein each of said clamp members comprises a substantially W-shaped configuration of metallic spring material affixed to the device housing.

4. An automatic clamping mechanism as defined in claim 3 wherein said biasing means comprise one or more spring sections integrally formed in each of said clamp members.

5. An automatic clamping mechanism as defined in claim 4 wherein said spring sections comprise helical coil spring sections integrally formed in each of said clamping members and arranged to bias said clamping members toward engagement.

6. An automatic clamping mechanism as defined in claim 1 wherein said monitoring device includes a pair of flexible magnetic core sections for receiving the cable, and said clamp members are arranged to bear outwardly against said core sections when said trigger member is in said axially aligned position.

7. An automatic clamping mechanism as defined in claim 1 wherein said trigger member wraps around a major portion of the circumference of the cable when said clamp members are pivoted into engagement with the cable.

8. An automatic clamping mechanism as defined in claim 1 wherein the spacing between said spaced-apart locations is greater than the diameter of the cable.

9. An automatic clamping mechanism as defined in claim 1 wherein said projecting portions of said clamp members overlap when pivoted toward each other.

* * * * *